US008395448B2

(12) United States Patent
Ivanov et al.

(10) Patent No.: US 8,395,448 B2
(45) Date of Patent: Mar. 12, 2013

(54) APPARATUS AND METHOD FOR MILLER COMPENSATION FOR MULTI-STAGE AMPLIFIER

(75) Inventors: Evgueni Ivanov, Wilmington, MA (US); Arthur Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 64 days.

(21) Appl. No.: 13/007,321

(22) Filed: Jan. 14, 2011

(65) Prior Publication Data

US 2012/0182075 A1    Jul. 19, 2012

(51) Int. Cl.
  *H03F 1/14*       (2006.01)
(52) U.S. Cl. .................... 330/292; 330/255
(58) Field of Classification Search ............ 330/292, 330/255, 261, 253
See application file for complete search history.

(56) References Cited

U.S. PATENT DOCUMENTS

| 5,877,654 | A | 3/1999 | Fong et al. | |
| 7,310,016 | B2 | 12/2007 | Chuang | |
| 7,414,473 | B1 * | 8/2008 | Rayanakorn et al. | 330/255 |
| 7,639,078 | B2 * | 12/2009 | Rayanakorn et al. | 330/255 |
| 7,786,801 | B2 * | 8/2010 | Kim | 330/255 |
| 8,054,134 | B2 * | 11/2011 | Huang et al. | 330/292 |
| 2003/0137351 | A1 | 7/2003 | Renous et al. | |
| 2006/0261860 | A1 | 11/2006 | Yamada | |

FOREIGN PATENT DOCUMENTS

FR  2 833 430    6/2003
WO  WO 02/01711 A1    1/2002

OTHER PUBLICATIONS

Bult, Klaas, and Geelen, Govert J.G.M., "A Fast-Settling CMOS Op Amp for SC Circuits with 90 dB DC Gain," IEEE Journal of Solid-State Circuits, Vo.. 25, No. 6, Dec. 1990.
Gulati, Kush and Lee, Hae Seung, "A High-Swing CMOS Telescopic Operational Amplifier," IEEE Journal of Solid-State Circuits, vol. 33, No. 12, Dec. 1998.
Huijsing, Johan H., "Low-Power Low-Voltage VLSI Operational Amplifier Cells," IEEE Transactions on Circuits and Systems-I: Fundamental Theory and Applications, vol. 42, No. 11, Nov. 1995.
Perlin, Gayatri E., Sodagar, Amir M., Wise, Kensall D., "A Neural Amplifier with High Programmable Gain and Tunable Bandwidth," $30^{th}$ Annual International IEEE EMBS Conference Vancouver, British Columbia, Canada, Aug. 20-24, 2008.
Razavi, Behzad, "Design of Analog CMOS Integrated Circuits," Stability and Frequency Compensation Chap. 10, pp. 361-364, 2001.
Thandri, Bharath Kumar and Silva-Martinez, Jose, "An overview of feed-forward design techniques for high-gain wideband operational transconductance amplifiers," Microelectronics Journal 37 1018-1029, Apr. 19, 2006.

(Continued)

*Primary Examiner* — Henry Choe
(74) *Attorney, Agent, or Firm* — Knobbe Martens Olson & Bear LLP (57) ABSTRACT

An amplifier circuit includes a first amplifier stage having a first output node; a second amplifier stage having a second output node; and a compensation block electrically coupled between the first and second output nodes. The compensation block has a compensation capacitor electrically coupled to the first node and electrically connectable to the second node, and has an impedance electrically connectable to the compensation capacitor. The compensation capacitor is electrically coupled via a switch to the impedance such that the compensation capacitor can contribute a zero to shunt branch formed by the compensation capacitor and impedance when the compensation capacitor is disconnected from the second node.

24 Claims, 7 Drawing Sheets

OTHER PUBLICATIONS

Bajoria S. et al., *Low Power High Bandwidth Amplifier with RC Miller and Gain Enhanced Feedforward Compensation*, 2008 ACM/IEEE International Symposium on Low Power Electronics and Design, IEEE, Aug. 11, 2008, pp. 193-196.

Search Report from the International Searching Authority in PCT/US2012/020427, dated Mar. 30, 2012, 5 pages.

Written Opinion from the International Searching Authority in PCT/US2012/020427, dated Mar. 30, 2012, 8 pages.

* cited by examiner

APPARATUS AND METHOD FOR MILLER COMPENSATION FOR MULTI-STAGE AMPLIFIER

BACKGROUND

1. Field

Embodiments of the invention relate to electronic devices, and more particularly, in one or more embodiments, to amplifiers.

2. Description of the Related Technology

Certain electronic devices employ amplifiers to process signals for transmission to an external device or further processing within the devices. Such amplifiers receive an input signal, and generate an output signal having a gain in comparison to the input signal. Among such amplifiers, operational amplifiers (op-amp) and instrumentation amplifiers (in-amp) are used in many applications. Certain operational amplifiers and instrumentation amplifiers are implemented in a multi-stage configuration to enhance gain and/or performance thereof.

In characterizing the frequency response of an operational amplifier or instrumentation amplifier, a gain-bandwidth product (GBWP) can be used. The term "gain-bandwidth product" refers to the product of the open-loop gain of an amplifier and its −3 dB open-loop bandwidth.

The gain-bandwidth product (GBWP) of an amplifier is determined by the position of the dominant pole of the transfer function of the amplifier in the frequency domain. The term "transfer function" refers to a mathematical representation, in terms of spatial or temporal frequency, of the relation between the input and output of an electronic system. The term "dominant pole" refers to a pole in the frequency domain that masks the effects of other poles.

In some instances, the dominant pole ($F_{DOM}$) of an amplifier can be defined by a compensation capacitor ($C_{COMP}$) and a dominant impedance ($R_{DOM}$) in the amplifier, as expressed in Equation (1) below. The compensation capacitor is typically a capacitor placed at the highest impedance node for frequency compensation for the amplifier, but can be placed in other nodes in the amplifier.

$$F_{DOM} = \frac{1}{2\pi \cdot C_{COMP} \cdot R_{DOM}} \quad \text{Equation (1)}$$

However, the gain-bandwidth product GBWP (or the dominant pole) cannot be arbitrarily increased. As the frequency of the GBWP of an amplifier approaches the frequency of the lowest-frequency secondary (or non-dominant) pole in the amplifier frequency response, the stability of the amplifier can be degraded. The maximum achievable frequency ($GBWP_{MAX}$) of the GBWP can be limited by the position of the lowest frequency non-dominant pole, and can be expressed in Equation (2) below, where $F_{NONDOM}$ is the frequency of the lowest non-dominant pole, and a is a value of 2 to 3.

$$GBWP_{MAX} \cong F_{NONDOM}/a \quad \text{Equation (2)}$$

Operational amplifiers and instrumental amplifiers are typically used in an electronic system in a closed loop or feedback configuration with a specific value of noise gain $G_{CL}$. In such a configuration, the actual GBWP of the system is a function of the frequency of the dominant pole, the open-loop gain $G_{OL}$ of the amplifier, and the noise gain $G_{CL}$ (assuming that there are no additional poles or zeros in the frequency response below the gain-bandwidth product GBWP). The gain-bandwidth product GBWP can be expressed in Equation (3) below.

$$GBWP = \frac{F_{DOM} \cdot G_{OL}}{G_{CL}} = \frac{G_{OL}}{2\pi \cdot C_{COMP} \cdot R_{DOM} \cdot G_{CL}} \quad \text{Equation (3)}$$

Unless the value of the noise gain is fixed in the integrated circuit (IC) of the amplifier, it can be usually adjusted by the users by, for example, selecting the values of external gain-setting components, by digital selection if the IC of the amplifier provides a digitally-controllable gain configuration, or the like. At the lowest noise gain, the gain-bandwidth product GBWP of an amplifier is typically the highest, and the phase margin (a measure of stability) is typically the lowest.

Typically, operational amplifiers and instrumental amplifiers are provided with guaranteed stability in a certain range of noise gains greater than some minimum noise gain, $G_{CL\_MIN}$. If the value of the compensation capacitor $C_{COMP}$ is constant and fixed (for example, when the amplifier IC has a single compensation capacitor), the gain-bandwidth product GBWP is reduced much below its maximum achievable amount $GBWP_{MAX}$ when the values of noise gain $G_{CL}$ are relatively high.

In some amplifier IC designs, a compensation capacitor can be located externally to the amplifier IC, in which case an end user can adjust the value of the compensation capacitor $C_{amp}$ according to the value of the noise gain $G_{CL}$ in order to increase the gain-bandwidth product GBWP. However, that solution adds the additional cost of the external capacitor and complicates the design of the application circuits.

In programmable-gain amplifiers (PGA), the amplifier IC can contain gain setting components (such as resistors) and switches or the like to select any value of the noise gain $G_{CL}$ across a range of pre-defined gain values. Typically, the selection of gain can be performed by a digital programming of the amplifier IC.

In addition to the gain selection, the amplifier IC can also have ability to adjust the gain-bandwidth product GBWP. This can be achieved by a bank of programmable compensation capacitors so that the value of the compensation capacitor $C_{COMP}$ can be adjusted together with the noise gain $G_{CL}$ in order to maintain or approach the maximum achievable gain-bandwidth product GBWP, that is, $GBWP_{MAX}$. The bank of capacitors can contain any number of capacitors, and the adjustment of the overall value of compensation capacitor $C_{COMP}$ can be achieved by digitally controlled analog switches, for example, metal-oxide-semiconductor field effect transistors (MOSFETs), connected to each capacitor in the bank.

Typically, operational amplifiers and instrumentation amplifiers have relatively high values of open loop gain, for example, about 140 to about 180 dB, in order to achieve relatively high precision (for example, relatively low nonlinearity, relatively low gain error, and/or relatively low distortion). In order to achieve such high amounts of open-loop gain, a multi-stage (for example, 2-stage, 3-stage, or 4-stage) amplifier architecture can be used. In some instances, a first stage of such an amplifier can include a gain-enhanced folded-cascode or telescopic cascode topology. A 2-stage amplifier architecture is often used because it can have a bandwidth/power factor advantage compared to the higher stage architectures (for example, 3-stage or 4-stage architecture) in which each additional stage contains an additional non-dominant pole, and consumes additional power.

Figure 1A:
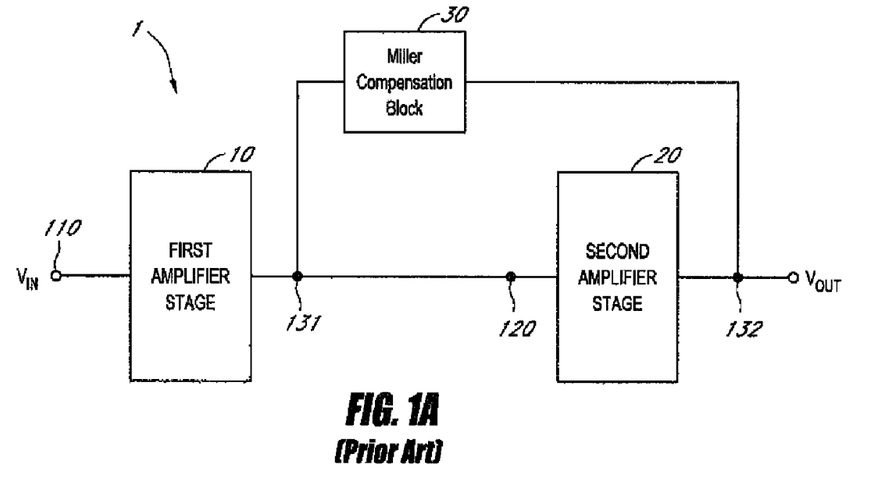
FIG. 1A is a schematic block diagram illustrating a conventional 2-stage amplifier with a Miller compensation block.

Referring to FIG. 1A, an electronic system including a conventional 2-stage amplifier will be described. The illustrated 2-stage amplifier 1 can form at least part of an operational amplifier or an instrumentation amplifier.

In the illustrated embodiment, the amplifier 1 includes a first amplifier stage 10, a second amplifier stage 20, a Miller compensation block 30, a first-stage input node 110, a first-stage output node 131, a second-stage input node 120, and a second-stage output node 132. The first amplifier stage 10 is electrically coupled to the Miller compensation block 30 via the first-stage output node 131. The Miller compensation block 30 is electrically coupled to the second amplifier stage 20 via the second-stage output node 132.

The first amplifier stage 10 receives an input signal Vin, for example, in a form of differential voltage signal, at the first-stage input node 110. The first amplifier stage 10 is configured to amplify the input signal Vin with a first gain. In some embodiments, the first gain can be a fixed gain. The first amplifier stage 10 outputs the amplified signal through the first-stage output node 131. In some instances, the first amplifier stage 10 can include a cascode arrangement, and gain enhancing or boosting amplifiers, as will be described in detail in connection with FIG. 3.

The second amplifier stage 20 receives the amplified signal from the first-stage output node 131 of the first amplifier stage 10 at the second-stage input node 120. In FIG. 1A, the second-stage input node 120 is shown to be separate from the first-stage output node 131, but is electrically shorted to the first-stage output node 13. The second amplifier stage 20 is configured to further amplify the amplified signal with a second gain. The second gain can be a fixed gain. In some embodiments, the gain of the system can be adjusted by programming the noise gain $G_{CL}$, using a programmable resistor network in a feedback circuit around the amplifier 1. The second amplifier stage 20 outputs the further amplified signal as an output signal $V_{out}$ through the second-stage output node 132.

Figure 1B:
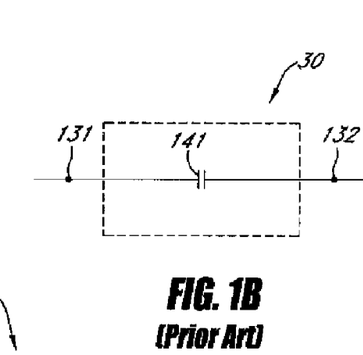
FIG. 1B is a schematic circuit diagram illustrating a conventional Miller compensation block.

The Miller compensation block 30 serves to introduce a dominant pole into the open loop frequency response of the amplifier 1. In one example, the Miller compensation block 30 can include a compensation capacitor 141, as shown in FIG. 1B. In the illustrated amplifier circuit, the highest impedance node in the circuit can be the first-stage output node 131. The impedance value at this node can be relatively high, for example, tens of Giga Ohms, in an example in which the first amplifier stage 10 has a cascode arrangement and gain-enhancement amplifiers. The Miller compensation block 30 allows the value of compensation capacitor $C_{COMP}$ to be reduced by the factor of the gain of the second amplifier stage 20. Another effect of Miller compensation is to lower the output impedance of the amplifier which normally shifts the position of the non-dominant pole at the output of the second amplifier stage 20 to a higher frequency (pole-splitting).

Figure 2A:
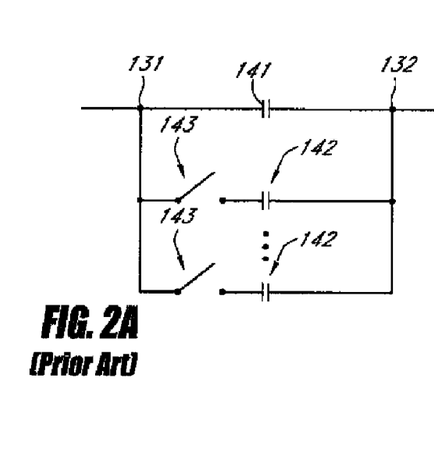
FIG. 2A is a schematic circuit diagram illustrating a conventional Miller compensation block for digital programming of the bandwidth of an amplifier.

However, if a digital programming of the amplifier bandwidth is desired for the 2-stage amplifier 1, the amplifier 1 can have a conventional Miller compensation block 30A shown in FIG. 2A in place of the Miller compensation block 30 of FIG. 1B. The Miller compensation block 30A includes a bank of additional or selectable compensation capacitors 142 between the nodes 131, 132 through switches 143. A skilled artisan will appreciate that the number of capacitor/switch sets can vary widely, depending on the configuration of the circuit. The switches 143 can be coupled between the left terminals of the additional compensation capacitors 142 and the first-stage output node 131. The switches 143 can be implemented with, for example, MOSFETs. In this case, however, the leakage currents arising from diffusion and channel sub-threshold leakages in the MOSFETs (more noticeable at higher temperatures) can significantly reduce the impedance at the first-stage output node 131, and therefore significantly reduce the value of open loop gain, and introduces offset errors.

Figure 2B:
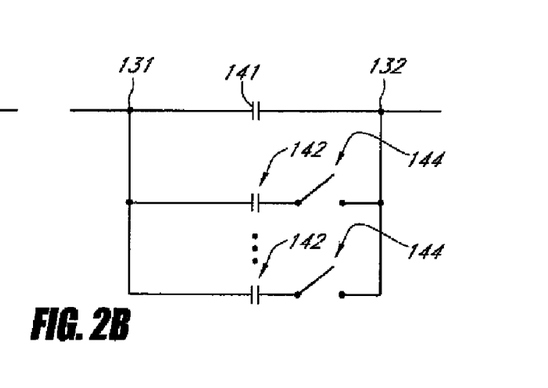
FIG. 2B is a schematic circuit diagram illustrating an example Miller compensation block for digital programming of the bandwidth of an amplifier.

FIG. 2B illustrates an example of an alternative Miller compensation block 30B that can be used in place of the Miller compensation block 30 of FIG. 1A. The Miller compensation block 30B includes switches 144 coupled between the right terminals of the additional compensation capacitors 142 and the second-stage input node 120, as shown in FIG. 2B. A skilled artisan will appreciate that the number of capacitor/switch sets can vary widely, depending on the design of the circuit. However, when one or more switches 144 are turned off, the unselected compensation capacitors 142 are left floating. The unselected compensation capacitors 142 can generate undesirable spurious long-settling components in the input offset voltage and in the transient response of the amplifier due to long-settling discharge of the unselected capacitors into the first-stage output node 131 from leakage currents of the switches 144.

SUMMARY

In one embodiment of the invention, an apparatus includes: a first amplifier stage of an amplifier circuit including a first output node; a second amplifier stage of the amplifier circuit including a second output node; and a compensation block of the amplifier circuit electrically coupled between the first and second output nodes. The compensation block includes a default compensation capacitor electrically coupled between the first and second output nodes; a selectable compensation capacitor, the selectable compensation capacitor having a first terminal electrically coupled to the first output node, and a second terminal electrically connectable via a first switch to the second output node or via a second switch to an impedance. The impedance can contribute a zero to the frequency response of the shunt branched formed when the selectable compensation capacitor is connected via the second switch.

In another embodiment, an apparatus includes: a first amplifier stage of an amplifier circuit including a first output node; a second amplifier stage of the amplifier circuit including a second output node; and a compensation block of the amplifier circuit electrically coupled between the first and second output nodes. The compensation block comprises: a default compensation capacitor electrically coupled between the first and second output nodes; a selectable compensation capacitor, the selectable compensation capacitor having a first terminal electrically coupled to the first output node, and a second terminal electrically connectable via a first switch to the second output node; and a bootstrapping circuit electrically connectable via a second switch to the second terminal of the selectable compensation capacitor. The selectable compensation capacitor is configured to be electrically coupled to the bootstrapping circuit when the selectable compensation capacitor is disconnected from the second output node such that the selectable compensation capacitor in series with the bootstrapping circuit has a zero in its impedance versus frequency.

In another embodiment, an electronic device comprises: first amplifying means for amplifying a signal to generate a first amplified signal at a first output node; second amplifying means for amplifying the first amplified signal to generate a second amplified signal at a second output node, first capacitive means for capacitively coupling the first and second output nodes; second capacitive means for selectively capacitively coupling the first and second output nodes; and means for providing an impedance in a branch containing the second capacitive means. In a first state, the second capacitive means capacitively couples the first and second output nodes. In a second state, the second capacitive means capacitively couples the first output node and the means for providing an impedance.

In yet another embodiment, a method of amplifying a signal comprises: amplifying the signal to generate a first amplified signal, wherein amplifying the signal is performed by a first amplifier stage such that the first amplified signal is available at a first output node; amplifying the first amplified signal to generate a second amplified signal, wherein amplifying the first amplified signal is performed by a second amplifier stage such that the second amplified signal is available at a second output node, wherein a first capacitor is electrically coupled between the first and second output nodes, and wherein a second capacitor has a first terminal electrically coupled to the first output node, and a second terminal. The method also includes, in a first state, electrically coupling the second terminal of the second capacitor to the second output node, and disconnecting the second terminal of the second capacitor from a bootstrapping circuit; and in a second state, electrically coupling the second terminal of the second capacitor to the bootstrapping circuit, and disconnecting the second terminal of the second capacitor from the second output node.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Miller Compensation with Selectable Capacitors

In one embodiment, a Miller compensation block can include a bank of selectable capacitors coupled between the first and second stages, and an impedance connectible to the capacitors when the capacitors are electrically disconnected from the second amplifier stage. The capacitors can have varying values, such as, binary weighting, but can also have the same value or "unit." While illustrated in connection with unit capacitors, the principles and advantages described herein are applicable to other weightings. This configuration allows the capacitors, when electrically disconnected from the output of the second amplifier stage, to have a DC path to ground to avoid being left floating. Further, the impedance can contribute a zero to the frequency response of a resulting shunt branch, thereby improving the phase margin and stability of the amplifier.

Figure 2C:
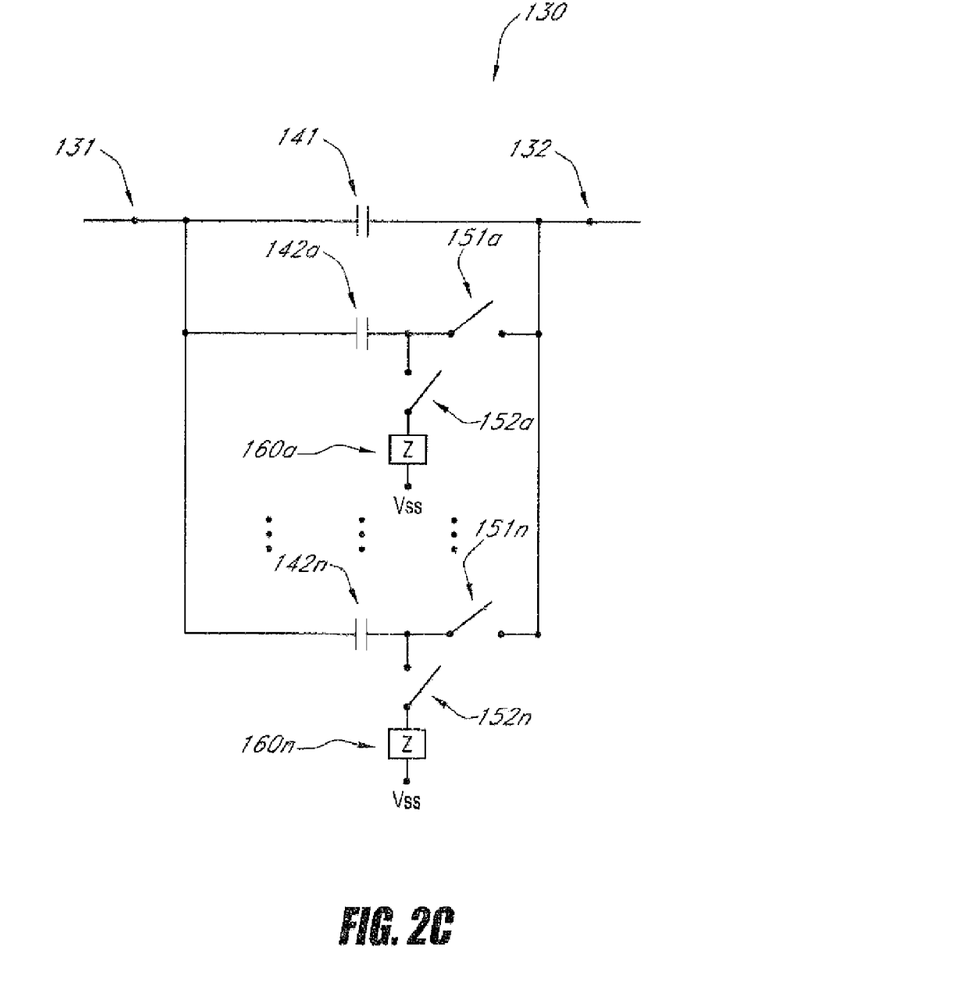
FIG. 2C is a schematic circuit diagram illustrating a Miller compensation block according to one embodiment.

Referring to FIG. 2C, a Miller compensation block 130 with an impedance according to one embodiment will be described below. The Miller compensation block 130 can be used in place of the Miller compensation block 30 in the amplifier 1 of FIG. 1A. In the illustrated embodiment, the Miller compensation block 130 includes a default Miller compensation capacitor 141, additional or selectable compensation capacitors 142a-142n, first switches 151a-151n, second switches 152a-152n, and impedances 160a-160n. In some embodiments, the default Miller compensation capacitor 141 corresponds to an explicit capacitor and not merely to parasitic capacitance that may be present.

The default Miller compensation capacitor 141 can have a first terminal electrically coupled to the first-stage output node 131 and a second terminal electrically coupled to the second-stage output node 132. Other details of the default Miller compensation capacitor 141 can be as described above in connection with the compensation capacitor 141 of FIGS. 1B, 2A, and 2B.

Each of the additional unit compensation capacitors 142a-142n can have a first terminal electrically coupled to the first-stage output node 131, and a second terminal electrically connectable to the second-stage output node 132 via a respective one of the first switches 151a-151n. The second terminal of each of the capacitors 142a-142n is also electrically connectable to a respective one of the impedances 160a-160n via a respective one of the second switches 152a-152n. Each of the impedances 160a-160n is electrically coupled between a respective one of the second switches 152a-152n and a voltage reference Vss (for example, ground). The first and second switches 151a-151n, 152a-152n can be digitally controlled by a controller (not shown) which can be either external to or part of the amplifier 1. A skilled artisan will appreciate that the number of sets of capacitors, first and second switches, and impedances can vary widely, depending on the circuit design and the programming resolution.

The above configuration of the Miller compensation block 130 can make it possible to control the value of GBWP of a 2-stage amplifier by adjusting the total amount of Miller compensation capacitance via control of digitally-controlled switches. In the illustrated embodiment, none of the switches 151a-151n, 152a-152n are connected directly to the first-stage output node 131 (that is, to a relatively high impedance node), and therefore the open-loop gain of the amplifier should not be degraded.

During operation, when a switch of the first switches 151a-152n is switched on, the corresponding second switch 152a-152n is switched off, and the corresponding capacitor 142a-142n is electrically connected to the second-stage output node 132. The capacitance of each capacitor is therefore added to the overall capacitance of the Miller compensation block 130 that contributes to the value of the compensation capacitor $C_{COMP}$.

When a switch of the first switches 151a-152n is switched off, the corresponding second switch 152a-152n is switched on, and the capacitor 142a-142n is electrically connected between the first-stage output node 131 and a respective impedance 160a-160n.

The impedances 160a-160n serve to provide a certain value of impedance between its terminals, which contributes a zero into the frequency response of a resulting shunt branch. Often, the resulting zero will cause a zero in the amplifier's overall frequency response. If the frequency position of the added zero in the overall response is higher than the frequency of the lowest non-dominant pole, this zero will typically not have any noticeable effect on the frequency response and stability of the amplifier. If, however, the position of the zero is relatively close to the frequency of the lowest non-dominant pole, the zero can improve the phase margin and stability of the amplifier.

Gain-Enhanced Folded-Cascode 2-Stage Amplifier with Miller Compensation

In one embodiment, a multi-stage amplifier can include a first amplifier stage and a second amplifier stage. The first amplifier stage can have, for example, a folded-cascode topology, but other topologies are possible. Further, the first amplifier stage can have gain enhancement, using additional gain enhancement amplifiers or stages. The first amplifier stage can have a relatively high impedance output node due to the gain enhancement. In such an embodiment, the amplifier can include a Miller compensation block having one or more impedances as described earlier in connection with FIG. 2C.

Figure 3:
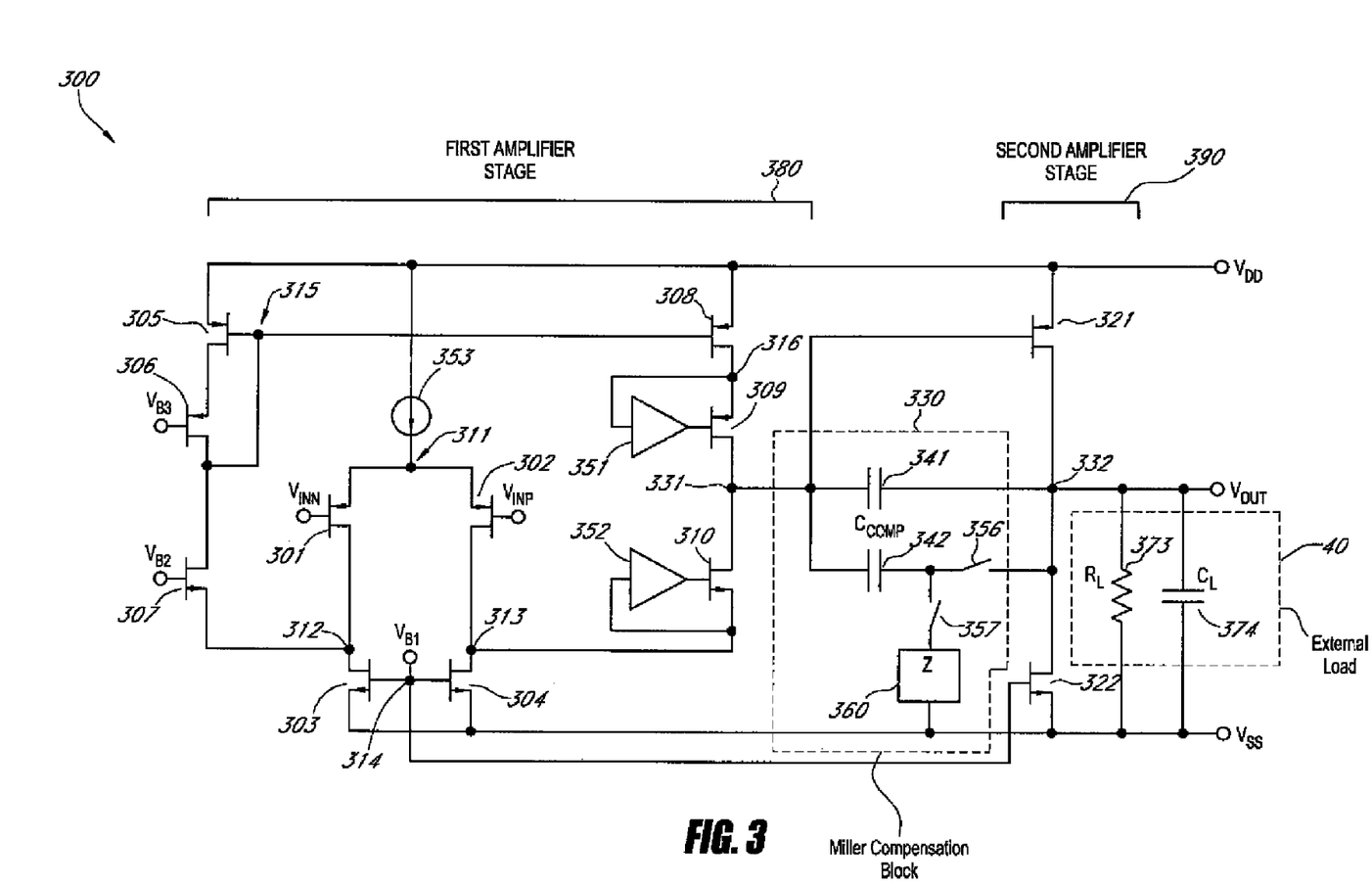
FIG. 3 is a circuit diagram of a gain-enhanced folded-cascode amplifier with a Miller compensation block according to one embodiment.

Referring to FIG. 3, a gain-enhanced folded-cascode 2-stage amplifier with Miller compensation according to one embodiment will be described below. The illustrated 2-stage amplifier 300 includes a first amplifier stage 380, a second amplifier stage 390, and a Miller compensation block 330. An external load 40 is illustrated in FIG. 3 for the sake of explanation, and can be external to the amplifier 300. The first amplifier stage 380 can include first to tenth transistors 301-310, first to fifth nodes 311-316, a first-stage output node 331, first and second gain enhancement amplifiers 351, 352, and a current source 353. The second amplifier stage 390 can include first and second second-stage transistors 321, 322, and a second-stage output node 332. The external load 40 can include a load resistor 373, and a load capacitor 374. The Miller compensation block 330 can include an optional default Miller capacitor 341, an additional Miller capacitor 342, a first switch 356, a second switch 357, and an impedance 360. A skilled artisan will appreciate that additional sets of Miller capacitors, first switches, second switches, and impedances can be added as described above in connection with FIG. 2C.

The first transistor 301 serves to receive an n-component $V_{INN}$ of a differential input signal, which can be in a form of voltage signal. In the illustrated embodiment, the first transistor 301 is a PMOS transistor having a source electrically coupled to the first node 311, a drain electrically coupled to the second node 312, and a gate configured to receive the n-component $V_{INN}$ of the input signal.

The second transistor 302 serves to receive a p-component $V_{INP}$ of the differential input signal. In one embodiment, the p-component is complementary to the n-component $V_{INN}$ of the input signal. In other embodiments, the p-component can be independent of the n-component $V_{INN}$ of the input signal. In the illustrated embodiment, the second transistor 302 is a PMOS transistor having a source electrically coupled to the first node 311, a drain electrically coupled to the third node 313, and a gate configured to receive the p-component $V_{INP}$ of the input signal. However, it will be understood that the mirror image version of the circuits of FIGS. 3-7 is also applicable such that, for example, the second transistor 302 can be an NMOS transistor, the direction of currents reversed, and in some instances, reversing of the voltage references $V_{DD}$ and $V_{SS}$.

The third transistor 303 provides a current source at the second node 312. The third transistor 303 can be an NMOS transistor having a source electrically coupled to a second voltage reference $V_{SS}$ (for example, ground), a drain electrically coupled to the second node 312, and a gate electrically coupled to a first bias voltage $V_{B1}$ via the fourth node 314.

The fourth transistor 304 provides a current source at the third node 313. The fourth transistor 304 can be an NMOS transistor having a source electrically coupled to the second voltage reference $V_{SS}$, a drain electrically coupled to the third node 313, and a gate electrically coupled to the first bias voltage $V_{B1}$ via the fourth node 314.

The fifth transistor 305 can be a PMOS transistor having a source electrically coupled to a first voltage reference $V_{DD}$, a drain electrically coupled to the source of the sixth transistor 306, and a gate electrically coupled to the fifth node 315.

The sixth transistor 306 can be a PMOS transistor having a source electrically coupled to the drain of the fifth transistor 305, a drain electrically coupled to the fifth node 315, and a gate electrically coupled to a third bias voltage $V_{B3}$. The seventh transistor 307 can be an NMOS transistor having a source electrically coupled to the second node 312, a drain electrically coupled to the fifth node 315, and a gate electrically coupled to a second bias voltage $V_{B2}$. The fifth to seventh transistors 305-307 form a first branch of a folded-cascode current mirror.

The eighth transistor 308 can be a PMOS transistor having a source electrically coupled to the first voltage reference $V_{DD}$, a drain electrically coupled to the sixth node 316, and a gate electrically coupled to the fifth node 315. The eighth transistor 308 serves to flow a current through to the ninth transistor 309 at least partly in response to a signal from the fifth node 315.

The ninth transistor 309 can be a PMOS transistor having a source electrically coupled to the sixth node 316, a drain electrically coupled to the first-stage output node 331, and a gate electrically coupled to the output of the first gain enhancement amplifier 351. The tenth transistor 310 can be an NMOS transistor having a drain electrically coupled to the first-stage output node 331, a source electrically coupled to the third node 313, and a gate electrically coupled to the output of the second gain enhancement amplifier 352. The eighth to tenth transistor 308-310 form a second branch of the folded-cascode current mirror. The eighth to tenth transistor 308-310 form a cascode circuit or stage, and can be referred to as "first to third cascode transistors," respectively, in the context of this document.

The first second-stage transistor 321 in the second amplifier stage 20 can be a PMOS transistor having a source electrically coupled to the first voltage reference $V_{DD}$, a drain electrically coupled to the second-stage output node 332, and a gate electrically coupled to the first-stage output node 331. The first second-stage transistor 321 serves to provide a relatively small gain for the second amplifier stage 20. For example, the gain can be between about 10 dB and about 50 dB.

The second second-stage transistor 322 in the second amplifier stage 20 can be an NMOS transistor having a source electrically coupled to the second voltage reference $V_{SS}$, a drain electrically coupled to the second-stage output node 332, and a gate electrically coupled to the first bias voltage $V_{E33}$ via the fourth node 314. The gate of the second second-stage transistor 322 can serve as a second-stage input node. The second second-stage transistor 322 serves as a current source that provides a current at least partly in response to the first bias voltage $V_{B1}$.

The first gain enhancement amplifier 351 includes an input electrically coupled to the sixth node 316, and an output electrically coupled to the gate of the ninth transistor 309. The second gain enhancement amplifier 352 includes an input electrically coupled to the third node 313, and an output electrically coupled to the gate of the tenth transistor 310. The gain enhancement amplifiers 351, 352 can also be referred to as "gain enhancement stages" or "gain boosting amplifiers or stages."

The gain enhancement amplifiers 351, 352 can provide the first amplifier stage 380 with an enhanced gain, compared to a first amplifier stage without them. The first gain enhancement amplifier 351 and the second gain enhancement amplifier 352 increase the cascoding effect of the ninth and tenth transistors 309, 310, respectively, by reducing the coupling from the first-stage output node 331 to the drain of the transistors. The enhancement amplifiers 351, 352 also increase the impedance of the first-stage output node 331 by the gain of the amplifiers 351, 352.

The current source 353 has a first terminal electrically coupled to the first voltage reference $V_{DD}$, and a second terminal electrically coupled to the first node 311. The current source 353 serves to provide a current to the first and second transistors 301, 302.

The load resistor 373 can have a first end electrically coupled to the second-stage output node 332, and a second end electrically coupled to the second voltage reference $V_{SS}$. The load capacitor 374 can have a first terminal electrically coupled to the second-stage output node 332, and a second terminal electrically coupled to the second voltage reference $V_{SS}$.

The default capacitor 341 in the Miller compensation block 330 can have a first terminal electrically coupled to the first-stage output node 331, and a second terminal electrically coupled to the second-stage output node 332. The additional Miller capacitor 342 can have a first terminal electrically coupled to the first-stage output node 331, and a second terminal electrically coupled to the first switch 356.

The first switch 356 has a first end electrically coupled to the additional Miller capacitor 342, and a second end electrically coupled to the second-stage output node 332. The second switch 357 is electrically coupled between the additional Miller capacitor 342 and the impedance 360. The impedance 360 is electrically coupled between the second switch 357 and the second voltage reference $V_{SS}$.

In the illustrated embodiment, only one set of the additional Miller capacitor 342, the first and second switches 356, 357, and the impedance 360 is illustrated in the Miller compensation block 330 for clarity. A skilled artisan will appreciate, however, that the number of such sets can vary widely, depending on the design and resolution of the circuit, as described above in connection with FIG. 2C. In the context of this document, the circuit shown in FIG. 3 can be referred to as a 2-stage gain-enhanced folded-cascode Miller amplifier.

In the illustrated embodiment, the first amplifier stage 380 is provided with gain enhancement by the gain enhancement amplifiers 361, 362, which makes the first-stage output node 331 have a relatively high impedance. The Miller compensation block 330 having the impedance(s) 360 can reduce problems described above in connection with FIGS. 1B, 2A, and 2B, while improving the phase margin and stability of the amplifier, as described above in connection with FIG. 2C.

Figure 4:
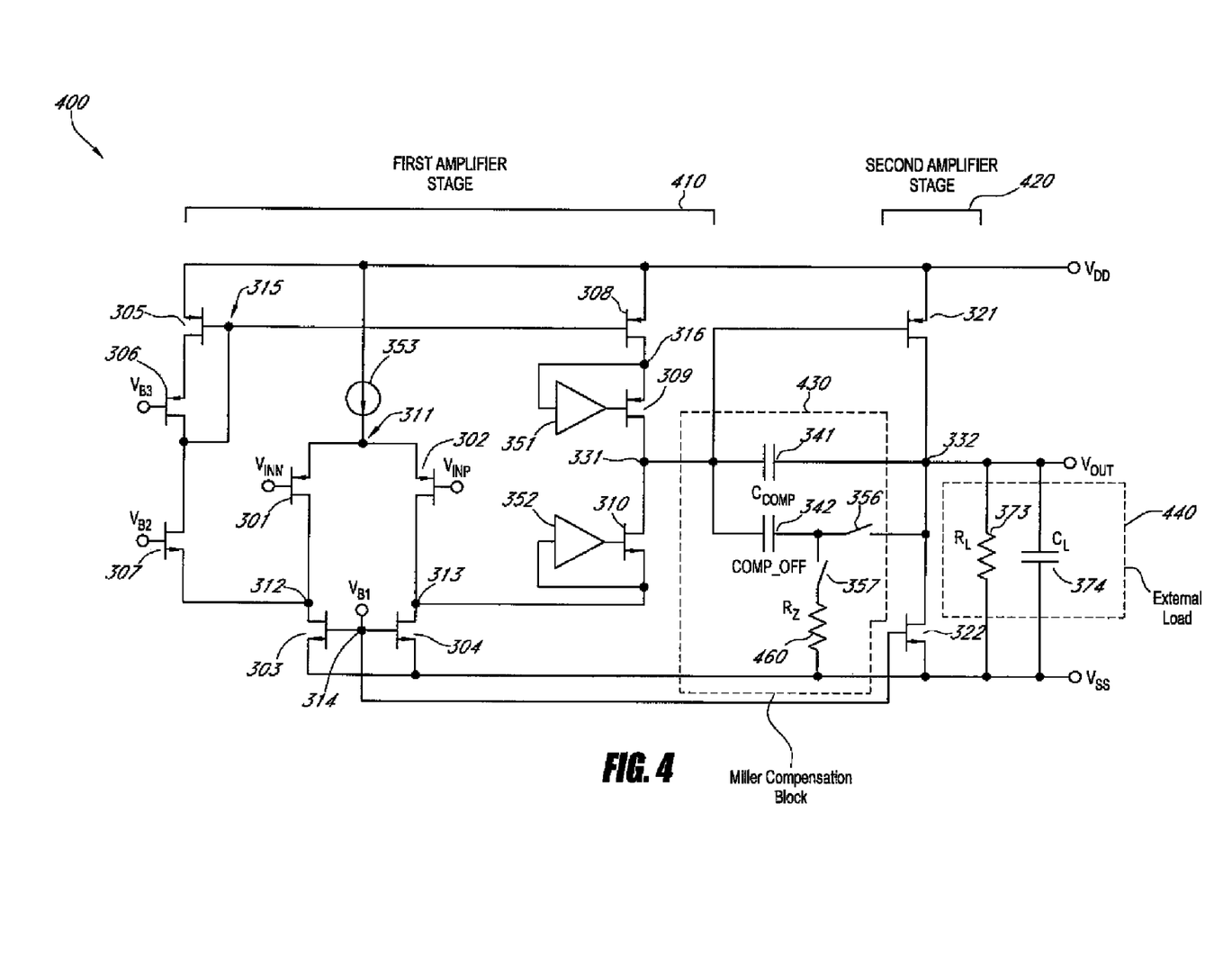
FIG. 4 is a circuit diagram of a gain-enhanced folded-cascode amplifier with a Miller compensation block according to another embodiment.

Referring to FIG. 4, a gain-enhanced folded-cascade 2-stage amplifier with Miller compensation according to another embodiment will be described below. The illustrated 2-stage amplifier 400 includes a first amplifier stage 410, a second amplifier stage 420, a Miller compensation block 430, and an external load 440. The external load 440 is included in FIG. 4 for the sake of explanation, and can be external to the amplifier 400.

The configurations of the first amplifier stage 410, the second amplifier stage 420, the Miller compensation block 430, and the external load 440 of FIG. 4 can be the same as those of the first amplifier stage 380, the second amplifier stage 390, the Miller compensation block 330, and the external load 40 of FIG. 3 except that the impedance 360 is replaced with a resistor 460. In some embodiments, the resistor 460 can be a variable resistor or a programmable resistor.

In the illustrated embodiment, only one set of the additional Miller capacitor 342, the first and second switches 356, 357, and the resistor 460 is illustrated in the Miller compensation block 430 for clarity. A skilled artisan will appreciate, however, that the number of such sets can vary widely, depending on the design and resolution of the circuit, as described above in connection with FIG. 2C.

During operation, the frequency response of the amplifier 400 is dominated by the dominant pole at the first-stage output node 331. A first non-dominant pole can be located at the second-stage output node 332. A zero can be formed by the additional Miller capacitor 342 having a second capacitance $C_{COMP\_OFF}$ when it is disconnected from the default Miller capacitor 341 having a first capacitance, and connected to the resistor 460 via the second switch 357 (that is, when the first switch 356 is switched off, and the second switch 357 is switched on). The additional Miller capacitor 342 in such a state can be referred to as an "unselected capacitor."

The effective frequency of the dominant pole can be expressed in Equation (4) below. In Equation (4), variable $C_{COMP}$ is the capacitance of the default Miller capacitor 341, and variable $C_{COMP\_OFF}$ is the capacitance of the additional Miller capacitor 342 when disconnected from the default Miller capacitor. Variable $A_2$ is the gain of the second amplifier stage 420, and can be expressed as $A_2 = G_{M2} \cdot R_{OUT}$ in which resistance $R_{OUT}$ includes both the impedance $R_L$ of the external load resistor 373, and the output impedance of the second-stage transistors 321, 322. Variable $G_{M2}$ is the transconductance of the first second-stage transistor 321

$$F_{DOM} \cong \frac{1}{2\pi \cdot (C_{COMP} \cdot A_2 + C_{COMP\_OFF}) \cdot R_{DOM}} \quad \text{Equation (4)}$$

The contribution of the Miller compensation capacitor 341 into the frequency of the dominant pole is multiplied by the gain $A_2$ of the second amplifier stage 420 due to the Miller effect. The Miller effect refers to an increase in the equivalent input capacitance of an inverting voltage amplifier due to amplification of the capacitance between the input and output terminals.

As noted above, the GBWP of an amplifier is a function of the frequency of the dominant pole and the open-loop gain $G_{CL}$ of the amplifier and noise gain $G_{CL}$, which can be expressed as Equation (5a) or (5b) below. It is assumed in this example that there are no additional poles or zeros in the frequency response below the value of GBWP. In Equation (5a), $G_{OL}=A_1 \cdot A_2{}^{\cdot}$, $A_1=G_{M1} \cdot R_{DOM}$, and $G_{M1}$ is the transconductance of the first and second first-stage transistors 301, 302.

$$GBWP = \frac{F_{DOM} \cdot OLG}{G_{CL}} = \frac{G_{M1} \cdot R_{DOM} \cdot A_2}{2\pi \cdot (C_{COMP} \cdot A_2 + C_{COMP\_OFF}) \cdot R_{DOM} \cdot G_{CL}} \quad \text{Equation (5a)}$$

$$GBWP = \frac{G_{M1}}{2\pi \cdot \left(C_{COMP} + \frac{C_{COMP\_OFF}}{A_2}\right) \cdot G_{CL}} \quad \text{Equation (5b)}$$

The configuration shown in FIG. 4 can provide a relatively robust performance at a relatively high load impedance at the output of the amplifier 400 when the gain $A_2$ of the second amplifier stage 420 is relatively high, and the contribution from the capacitance $C_{COMP\_OFF}$ of the unselected capacitor into the frequency of the GBWP is relatively small compared to the contribution of the capacitance $C_{COMP}$ of the default Miller capacitor 341. However, at relatively low values of load impedance, the gain of the second amplifier stage 420 becomes lower, and the contribution of the unused capacitance of the additional Miller capacitor 342 into the frequency value of the dominant pole can become significant.

In a typical in-amp or op-amp application, the load impedance can be chosen by the users within a wide range from relatively low values to relatively very high values. In this case, the frequency of the GBWP becomes dependent on the load impedance at relatively low values of the load impedance, and as a consequence, the GBWP also becomes dependent on the load impedance according to the Equation (5a) or (5b) above. One of the solutions is to decrease the frequency of the zero, $\frac{1}{2}\pi(C_{COMP\_OFF}*R_Z)$, far below the GBWP by increasing the value of $R_Z$ (for example, the value of the resistor 460 in FIG. 4) so that the contribution of the $C_{COMP\_OFF}$ into the frequency response of the dominant pole is cancelled at frequencies above $\frac{1}{2}\pi(C_{COMP\_OFF}*R_Z)$ and therefore does not affect the value of the GBWP. However, in this case, the relatively low frequency zero, $\frac{1}{2}\pi$ $(C_{COMP\_OFF}*R_Z)$, can cause a slow-settling component in the transient response of the amplifier and degrade the settling speed and accuracy of the amplifier. Such problems can be addressed by active bootstrapping, as will be described below.

Figure 5:
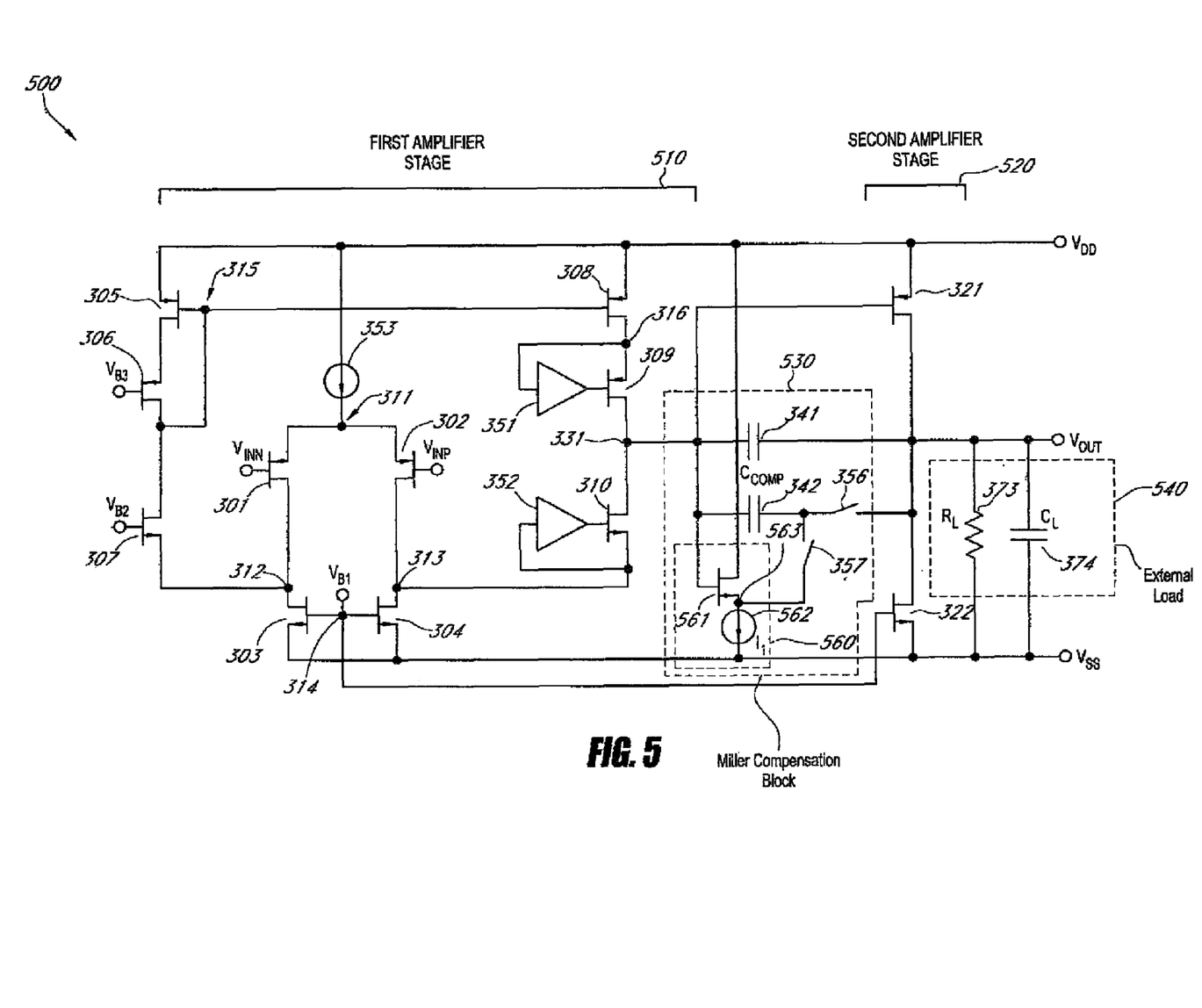
FIG. 5 is a circuit diagram of a gain-enhanced folded-cascode amplifier with a Miller compensation block according to yet another embodiment.

Referring to FIG. 5, a gain-enhanced folded-cascode 2-stage amplifier with Miller compensation according to yet another embodiment will be described below. The illustrated 2-stage amplifier 500 includes a first amplifier stage 510, a second amplifier stage 520, and a Miller compensation block 530. An external load 540 is illustrated in FIG. 5 for the sake of explanation, and can be external to the amplifier 500.

The configurations of the first amplifier stage 510, the second amplifier stage 520, the Miller compensation block 530, and the external load 540 of FIG. 5 can be the same as those of the first amplifier stage 380, the second amplifier stage 390, the Miller compensation block 330, and the external load 40 of FIG. 3 except that the Miller compensation block 530 includes a bootstrapping circuit 560. In one embodiment, the boot-strapping circuit 560 can be implemented as a unity-gain buffer. In other embodiments, the boot-strapping circuit 560 can have any other suitable configuration.

In the illustrated embodiment, the unity-gain buffer comprises a source-follower transistor 561, a second current source 562, and a seventh node 563. In other embodiments, the unity-gain buffer can have any other suitable configuration.

In one embodiment, the transistor 561 is in a common-drain configuration. The transistor 561 can be an NMOS transistor having a source electrically coupled to the seventh node 563, a drain electrically coupled to the first voltage reference $V_{DD}$, and a gate electrically coupled to the first-stage output node 331. The second current source 562 can be coupled between the seventh node 563 and the second voltage reference $V_{SS}$ such that a current $I_1$ flows toward the second voltage reference $V_{SS}$. The seventh node 563 is electrically coupled to the second switch 357 such that the second switch 357 is electrically coupled between the additional Miller capacitor 342 and the seventh node 563. In another embodiment, the transistor 561 can be an NPN bipolar transistor.

In yet another embodiment, the mirror image version of the bootstrapping circuit 560 can be used in place of the bootstrapping circuit 560 of FIG. 5. In such an embodiment, the bootstrapping circuit can include a PMOS transistor having a source electrically coupled to the seventh node 563, a drain electrically coupled to the second voltage reference $V_{SS}$, and a gate electrically coupled to the first-stage output node 331. The seventh node 563 is electrically coupled to the second switch 357. The bootstrapping circuit can also include a second current source electrically coupled between the seventh node 563 and the first voltage reference $V_{DD}$ such that a current $I_1$ flows toward the seventh node 563. In yet another embodiment, the PMOS transistor can be replaced with a PNP bipolar transistor.

In the illustrated embodiment, only one set of the additional Miller capacitor 342, the first and second switches 356, 357, the transistor 561, and the second current source 562 is illustrated in the Miller compensation block 530 for clarity. A skilled artisan will appreciate, however, that the number of such sets can vary widely, depending on the design and resolution of the circuit, as described above in connection with FIG. 2C.

In the illustrated embodiment, the GBWP of the amplifier 500 does not change at relatively low values of load impedance while the transient settling speed and accuracy are not affected. This is achieved by the active bootstrapping circuit 560. The active bootstrapping circuit ensures fast and accurate settling of the voltage across the unused capacitors of the Miller compensation block 530, and at the same time provides relatively high impedance at the first stage output node 331, thereby reducing the influence of $C_{COMP\_OFF}$ on the amplifier's GBWP.

Figure 6:
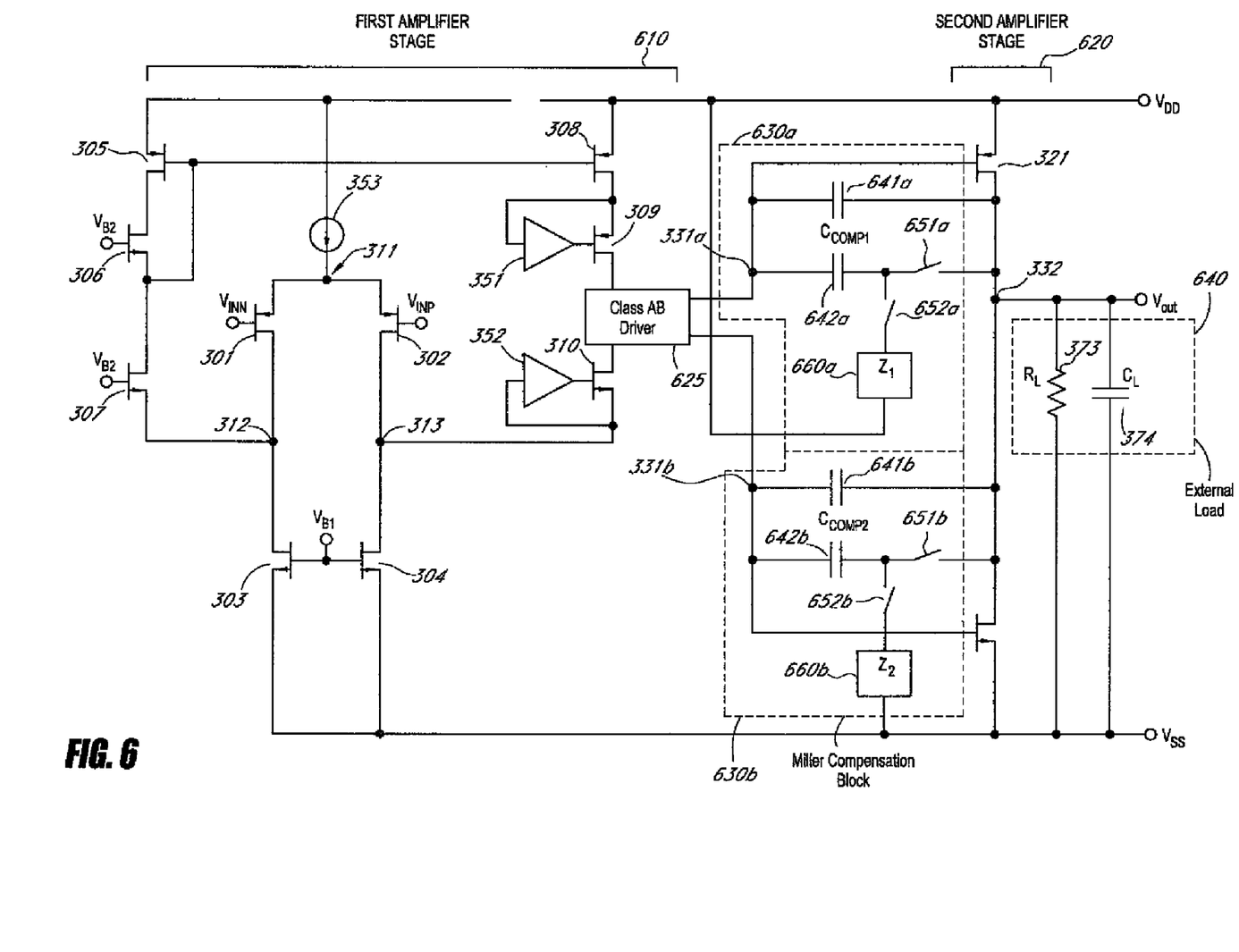
FIG. 6 is a circuit diagram of a gain-enhanced folded-cascode amplifier with a class AB driving circuit and a Miller compensation block according to yet another embodiment.

Referring to FIG. 6, a gain-enhanced folded-cascode 2-stage amplifier having a class AB driver with Miller compensation according to yet another embodiment will be described below. The illustrated 2-stage amplifier 600 includes a first amplifier stage 610, a second amplifier stage 620, and first and second Miller compensation blocks 630a. An external load 640 is illustrated in FIG. 6 for the sake of explanation, and can be external to the amplifier 600.

The configuration of the first amplifier stage 610 can be the same as that of the first amplifier stage 380 of FIG. 3 except that the first amplifier stage 610 includes a class AB driver that has inputs electrically coupled to the drain of the ninth transistor 309 and the drain of the tenth transistor 310, respectively. A skilled artisan will appreciate that the class AB driver can be any suitable class AB driver that can be driven by the voltage difference between the drain of the ninth transistor 309 and the drain of the tenth transistor 310. The class AB driver also has a first output forming a first output node 331a of the first amplifier stage 610, and a second output forming a second output node 331b of the first amplifier stage 610.

The configurations of the second amplifier stage 620 and the external load 640 can be the same as those of the second amplifier stage 390 and the external load 40 of FIG. 3 except that the gate of the first second-stage transistor 321 is electrically coupled to the first output node 331a of the first amplifier stage 610, and that the gate of the second second-stage transistor 322 is electrically coupled to the second output node 331b of the first amplifier stage 610.

The first Miller compensation blocks 630a can include a default Miller capacitor 641a, an additional Miller capacitor 642a, a first switch 651a, a second switch 652a, and an impedance 660a. The default Miller capacitor 641a is electrically coupled between the first output node 331a of the first amplifier stage 610 and the second-stage output node 332. The additional Miller capacitor 642a is electrically coupled between the first output node 331a of the first amplifier stage 610 and the first switch 651a. The first switch 651a is electrically coupled between the additional Miller capacitor 642a and the second-stage output node 332. The second switch 652a is electrically coupled between the additional Miller capacitor 642a and the impedance 660a. The impedance 660a is electrically coupled between the second switch 652a and the first voltage reference $V_{DD}$. Other details of the foregoing components can be as described above in connection with the Miller compensation block 330 of FIG. 3.

The second Miller compensation blocks 630b can include a default Miller capacitor 641b, an additional Miller capacitor 642b, a first switch 651b, a second switch 652b, and an impedance 660b. The default Miller capacitor 641b is electrically coupled between the second output node 331b of the first amplifier stage 610 and the second-stage output node 332. The additional Miller capacitor 642b is electrically coupled between the second output node 331b of the first amplifier stage 610 and the first switch 651b. The first switch 651b is electrically coupled between the additional Miller capacitor 642b and the second-stage output node 332. The second switch 652b is electrically coupled between the additional Miller capacitor 642b and the impedance 660b. The impedance 660b is electrically coupled between the second switch 652b and the second voltage reference $V_{SS}$. Other details of the foregoing components can be as described above in connection with the Miller compensation block 330 of FIG. 3.

In the illustrated embodiment, only one set of the additional Miller capacitor, the first and second switches, and the impedance is included in each of the Miller compensation blocks 630a, 630b for the sake of simplicity. A skilled artisan will, however, appreciate that the number of such sets can vary widely, depending on the design and resolution of the circuit, as described above in connection with FIG. 2C.

The illustrated amplifier 600 has two high-impedance nodes 331a, 331b, and thus uses two Miller compensation blocks 630a, 630b between the high-impedance nodes 331a, 331b and the second-stage output node 332. In this embodiment, two switched capacitor banks with two impedances 660a, 660b are used together with the default Miller capacitors 641a, 641b. Each impedance 660a, 660b can be implemented as a simple resistor, as described above in connection with FIG. 4. In other embodiments, each of the two Miller compensation blocks 630a, 630b can include a bootstrapping circuit, as described above in connection with FIG. 5.

Gain-Enhanced Telescopic Cascode 2-Stage Amplifier with Miller Compensation

Figure 7:
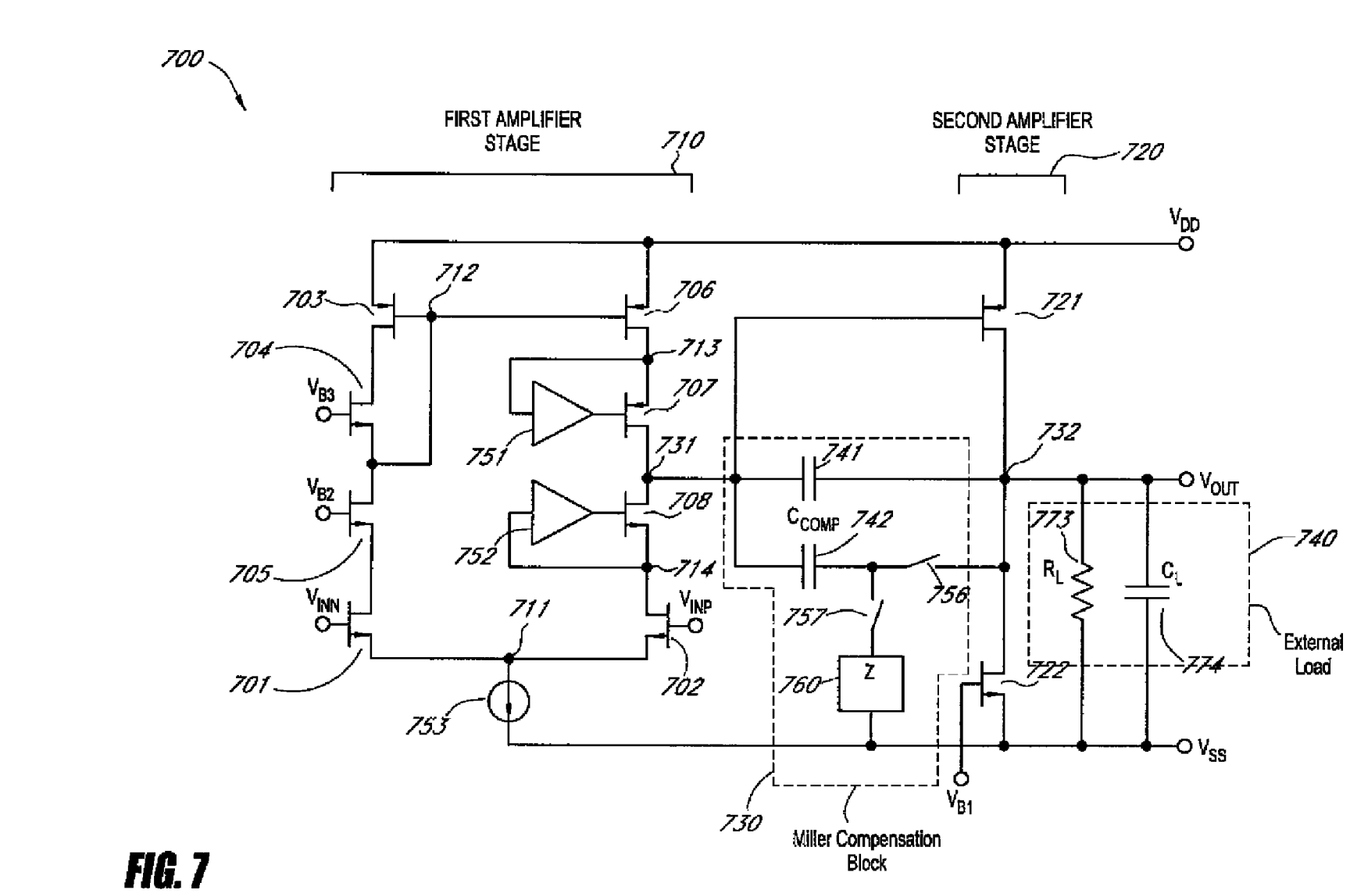
FIG. 7 is a circuit diagram of a gain-enhanced telescopic cascode amplifier with a Miller compensation block according to yet another embodiment.

Referring to FIG. 7, a gain-enhanced telescopic cascode 2-stage amplifier with Miller compensation according to yet another embodiment will be described below. In the illustrated embodiment, the amplifier 700 includes a first amplifier stage 710, a second amplifier stage 720, and a Miller compensation block 730. An external load 740 is illustrated in FIG. 7 for the sake of explanation, and can be external to the amplifier 700.

In the illustrated embodiment, the first amplifier stage 710 includes first to eighth transistors 701-708, first to fourth nodes 711-714, a first-stage output node 731, first and second gain enhancement amplifiers 751, 752, and a current source 753. The second amplifier stage 720 can include first and second second-stage transistors 721, 722. The external load 740 can include a load resistor 773 and a load capacitor 774. The Miller compensation block 730 can include a default Miller capacitor 741, an additional Miller capacitor 742, a first switch 756, a second switch 757, and an impedance 760. A skilled artisan will appreciate that additional sets of additional Miller capacitors, first switches, second switches, and impedances can be added.

The first amplifier stage 710 has a telescopic cascode gain-enhancement topology, which is different from the folded cascade topology of the amplifiers of FIGS. 3-6. However, the configurations of the second amplifier stage 720 and the Miller compensation block 730 of FIG. 7 can be the same as those of the second amplifier stage 390 and the Miller compensation block 330 of FIG. 3.

The first transistor 701 serves to receive an n-component $V_{INN}$ of a differential input signal, which can be in a form of voltage signal. In the illustrated embodiment, the first transistor 701 is an NMOS transistor having a source electrically coupled to the first node 711, a drain electrically coupled to the source of the fifth transistor 705, and a gate configured to receive the n-component $V_{INN}$ of the input signal.

The second transistor 702 serves to receive a p-component $V_{INP}$ of the differential input signal. In the illustrated embodiment, the second transistor 702 is an NMOS transistor having a source electrically coupled to the first node 711, a drain electrically coupled to the fourth node 714, and a gate configured to receive the p-component $V_{INP}$ of the input signal.

The third transistor 703 can be a PMOS transistor having a source electrically coupled to a first voltage reference $V_{DD}$, a drain electrically coupled to the source of the fourth transistor 704, and a gate electrically coupled to the second node 712.

The fourth transistor 704 can be a PMOS transistor having a source electrically coupled to the drain of the third transistor 703, a drain electrically coupled to the second node 712, and a gate electrically coupled to a third bias voltage $V_{B3}$. The fifth transistor 705 can be an NMOS transistor having a source electrically coupled to the drain of the first transistor 701, a drain electrically coupled to the second node 712, and a gate electrically coupled to a second bias voltage $V_{B2}$. The third to fifth transistors 703-705 form a first branch of a telescopic-cascode current mirror.

The sixth transistor 706 can be a PMOS transistor having a source electrically coupled to the first voltage reference $V_{DD}$, a drain electrically coupled to the third node 713, and a gate electrically coupled to the second node 712. The sixth transistor 706 serves to flow a current to the seventh transistor 707 at least partly in response to a signal from the second node 712.

The seventh transistor 707 can be a PMOS transistor having a source electrically coupled to the third node 713, a drain electrically coupled to a first-stage output node 731, and a gate electrically coupled to the output of the first gain enhancement amplifier 751. The eighth transistor 708 can be an NMOS transistor having a drain electrically coupled to the first-stage output node 731, a source electrically coupled to the fourth node 714, and a gate electrically coupled to the output of the second gain enhancement amplifier 752. The sixth to eighth transistors 706-708 form a second branch of the telescopic-cascode current mirror.

The first gain enhancement amplifier 751 includes an input electrically coupled to the third node 713, and an output electrically coupled to the gate of the seventh transistor 707. The second gain enhancement amplifier 752 includes an input electrically coupled to the fourth node 714, and an output electrically coupled to the gate of the eighth transistor 708. The first gain enhancement amplifier 751 and the second gain enhancement amplifier 752 provide the first amplifier stage 710 with an enhanced gain, compared to a first amplifier stage without them. The first gain enhancement amplifier 751 and the second gain enhancement amplifier 752 also increase the impedance of the first-stage output node 731.

The current source 753 has a first terminal electrically coupled to the first node 711, and a second terminal electrically coupled to the second voltage reference $V_{SS}$. The current source 753 serves to provide currents to pass through the first and second transistors 701, 702.

Similar to the amplifiers of FIGS. 3-6 having a folded cascode topology, the amplifier 700 has a first-stage output node having a relatively high impedance. The Miller compensation block 730 provides enhanced performance, as described above in connection with FIGS. 2C-6. In the other embodiments; the Miller compensation block 730 can have any of the configurations described above in connection with FIGS. 4-6.

In the embodiments described above in connection with FIGS. 3-7, the polarities of the transistors are only for example. For each of the embodiments, a complementary configuration is also possible such that PMOS and NMOS transistors are replaced with NMOS and PMOS transistors, respectively, and $V_{DD}$ and $V_{SS}$ supplies are interchanged.

Applications

The embodiments described above allow op-amps and in-amps to have an adjustable value of bandwidth. At gains higher than 1, the frequency of the dominant pole of such amplifiers can be increased to maximize the value of GBWP. The principles and advantages of the embodiments are applicable to any programmable gain multi-stage amplifier design (including, but not limited to, 2-stage, 3-stage, or 4-stage amplifier design), and allow it to achieve the maximum bandwidth for any programmable value of the noise gain.

Thus, a skilled artisan will appreciate that the configurations and principles of the embodiments can be adapted for any other suitable electronic devices. The circuits employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include circuits of optical networks or other communication networks, and disk driver circuits. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a first amplifier stage of an amplifier circuit including a first output node;
a second amplifier stage of the amplifier circuit including a second output node; and
a compensation block of the amplifier circuit electrically coupled between the first and second output nodes, wherein the compensation block comprises:
a default compensation capacitor electrically coupled between the first and second output nodes;
a selectable compensation capacitor, the selectable compensation capacitor having a first terminal electrically coupled to the first output node, and a second terminal electrically connectable via a first switch to the second output node; and
an impedance electrically connectable via a second switch to the second terminal of the selectable compensation capacitor,
wherein the selectable compensation capacitor is configured to be electrically coupled in series with the impedance when the selectable compensation capacitor is disconnected from the second output node.

2. The apparatus of claim 1, wherein the selectable compensation capacitor in series with the impedance has a zero in its impedance versus frequency.

3. The apparatus of claim 1, wherein the first switch has a first end electrically coupled to the second terminal of the selectable compensation capacitor, and a second end electrically coupled to the second output node; and
wherein the second switch has a first end electrically coupled to the second terminal of the selectable compensation capacitor, and a second end electrically coupled to the impedance.

4. The apparatus of claim 3, wherein the first switch is configured to be switched on when the second switch is switched off, and wherein the first switch is configured to be switched off when the second switch is switched on.

5. The apparatus of claim 3, wherein each of the first and second switches comprises metal-oxide-semiconductor field effect transistors.

6. The apparatus of claim 3, wherein the impedance comprises a resistor having a first end and a second end, wherein the first end of the resistor is electrically coupled to the second end of the second switch, and the second end of the resistor is electrically coupled to a voltage reference.

7. The apparatus of claim 1, wherein the first amplifier stage further includes a third output node, and wherein the apparatus further comprises another compensation block electrically coupled between the second and third output nodes,
wherein the compensation block comprises a second default compensation capacitor electrically coupled between the third and second output nodes; a second selectable compensation capacitor and a second impedance, the second selectable compensation capacitor having a first terminal electrically coupled to the third output node, and a second terminal electrically connectable via a third switch to the second output node, the second impedance being electrically connectable via a fourth switch to the second terminal of the second selectable compensation capacitor,
wherein the second selectable compensation capacitor is configured to be electrically coupled to the second impedance such that the second selectable compensation capacitor contributes a zero to a frequency response of the amplifier circuit when the second selectable compensation capacitor is disconnected from the second output node.

8. The apparatus of claim 7, wherein the first amplifier stage comprises a class AB driver having the first and the third output nodes as output nodes.

9. The apparatus of claim 1, wherein the first amplifier stage further comprises one or more gain enhancement amplifiers.

10. The apparatus of claim 9, wherein the first amplifier stage further comprises a cascode stage that comprises first to third cascode transistors and first and second gain enhancement amplifiers,
wherein the first cascode transistor is electrically coupled between a first voltage reference and the second cascode transistor via a first cascode node,
wherein the second cascode transistor is electrically coupled between the first cascode node and the first output node of the first amplifier stage,
wherein the third cascode transistor is electrically coupled between the first output node of the first amplifier stage and a second cascade node,
wherein the first gain enhancement amplifier has an input electrically coupled to the first cascade node, and an output electrically coupled to the gate of the second cascode transistor, and
wherein the second gain enhancement amplifier has an input electrically coupled to the second cascode node, and an output electrically coupled to the gate of the third cascode transistor.

11. The apparatus of claim 9, wherein the first amplifier stage comprises a folded-cascode topology or telescopic cascode topology which has the first output node as an output node.

12. The apparatus of claim 1, wherein the second amplifier stage comprises a first second-stage transistor electrically coupled between a first voltage reference and the second output node; a second second-stage transistor electrically coupled between the second output node and a second voltage reference, the second voltage reference providing a lower voltage than the first voltage reference, wherein the first second-stage transistor has a gate electrically coupled to the first output node, and wherein the second second-stage transistor has a gate electrically coupled to a bias voltage.

13. The apparatus of claim 12, wherein the second amplifier stage further comprises a load resistor and a load capacitor, both of which are electrically coupled between the second output node and the second voltage reference.

14. The apparatus of claim 1, wherein the amplifier is at least part of an operational amplifier or an instrumentation amplifier.

15. An apparatus comprising:
a first amplifier stage of an amplifier circuit including a first output node;
a second amplifier stage of the amplifier circuit including a second output node; and
a compensation block of the amplifier circuit electrically coupled between the first and second output nodes, wherein the compensation block comprises:
a default compensation capacitor electrically coupled between the first and second output nodes;
a selectable compensation capacitor, the selectable compensation capacitor having a first terminal electrically coupled to the first output node, and a second terminal electrically connectable via a first switch to the second output node; and
a bootstrapping circuit electrically connectable via a second switch to the second terminal of the selectable compensation capacitor,
wherein the selectable compensation capacitor is configured to be electrically coupled in series with the bootstrapping circuit when the selectable compensation capacitor is disconnected from the second output node.

16. The apparatus of claim 15, wherein the first switch has a first end electrically coupled to the second terminal of the selectable compensation capacitor, and a second end electrically coupled to the second output node; and
wherein the second switch has a first end electrically coupled to the second terminal of the selectable compensation capacitor, and a second end electrically coupled to the bootstrapping circuit.

17. The apparatus of claim 16, wherein the bootstrapping circuit comprises a unity-gain buffer.

18. The apparatus of claim 17, wherein the unity-gain buffer comprises:
a transistor electrically coupled between a first voltage reference and the second end of the second switch, the transistor having a gate electrically coupled to the first output node; and
a current source electrically coupled between a second voltage reference and the second end of the second switch, wherein the second voltage reference provides a voltage lower than that of the first voltage reference, and wherein the current source generates a current flowing toward the second voltage reference.

19. The apparatus of claim 17, wherein the unity-gain buffer comprises:
a transistor electrically coupled between a second voltage reference and the second end of the second switch, the transistor having a gate electrically coupled to the first output node; and
a current source electrically coupled between a first voltage reference and the second end of the second switch, wherein the second voltage reference provides a voltage lower than that of the first voltage reference, and wherein the current source generates a current flowing toward the second switch.

20. An electronic device comprising:
- first amplifying means for amplifying a signal to generate a first amplified signal at a first output node;
- second amplifying means for amplifying the first amplified signal to generate a second amplified signal at a second output node,
- first capacitive means for capacitively coupling the first and second output nodes;
- second capacitive means for selectively capacitively coupling the first and second output nodes; and
- means for providing an impedance in a branch containing the second capacitive means,
- wherein, in a first state, the second capacitive means capacitively couples the first and second output nodes, and
- wherein, in a second state, the second capacitive means capacitively couples the first output node and the means for providing an impedance.

21. The device of claim 20, wherein the second capacitive means comprises a first terminal electrically coupled to the first output node, and a second terminal, wherein the device further comprises:
- first switching means for selectively coupling the second terminal of the second capacitive means to the second output node; and
- second switching means for selectively coupling the second terminal of the second capacitive means to the means for providing an impedance.

22. The device of claim 20, wherein the first amplifying means comprises one or more gain enhancement means for enhancing the gain of the first amplifying means.

23. A method of amplifying a signal, the method comprising:
- amplifying the signal to generate a first amplified signal, wherein amplifying the signal is performed by a first amplifier stage such that the first amplified signal is available at a first output node;
- amplifying the first amplified signal to generate a second amplified signal, wherein amplifying the first amplified signal is performed by a second amplifier stage such that the second amplified signal is available at a second output node, wherein a first capacitor is electrically coupled between the first and second output nodes, and wherein a second capacitor has a first terminal electrically coupled to the first output node, and a second terminal;
- in a first state, electrically coupling the second terminal of the second capacitor to the second output node, and disconnecting the second terminal of the second capacitor from an impedance; and
- in a second state, electrically coupling the second terminal of the second capacitor in series with the impedance, and disconnecting the second terminal of the second capacitor from the second output node.

24. The method of claim 23, wherein the method comprises:
- switching on a first switch coupled between the second terminal of the second capacitor and the second output node, and switching off a second switch coupled between the second terminal of the second capacitor and the impedance, in the first state; and
- switching off the first switch, and switching on the second switch in the second state.

* * * * *